US010720540B2

(12) United States Patent
Wang et al.

(10) Patent No.: US 10,720,540 B2
(45) Date of Patent: Jul. 21, 2020

(54) SOLAR PHOTOVOLTAIC ASSEMBLY

(75) Inventors: Yong Wang, Shanghai (CN); Xiaoqun Chen, Shanghai (CN); Chunfu Zhou, Shanghai (CN)

(73) Assignee: Tyco Electronics (Shanghai) Co. Ltd., Shanghai (CN)

( * ) Notice: Subject to any disclaimer, the term of this patent is extended or adjusted under 35 U.S.C. 154(b) by 1101 days.

(21) Appl. No.: 13/087,886

(22) Filed: Apr. 15, 2011

(65) Prior Publication Data

US 2011/0253192 A1    Oct. 20, 2011

(30) Foreign Application Priority Data

Apr. 20, 2010 (CN) ..................... 2010 2 0167043 U

(51) Int. Cl.
*H01L 31/05* (2014.01)
*H02S 40/34* (2014.01)
*H02S 40/36* (2014.01)

(52) U.S. Cl.
CPC .............. *H01L 31/05* (2013.01); *H02S 40/34* (2014.12); *H02S 40/36* (2014.12); *Y02E 10/50* (2013.01)

(58) Field of Classification Search
CPC ...... H01L 31/0485; H01L 31/05; H02S 40/34
USPC .......................................................... 136/244
See application file for complete search history.

(56) References Cited

U.S. PATENT DOCUMENTS

| 4,654,470 | A * | 3/1987 | Feldman et al. ................. 174/50 |
| 6,582,249 | B1 * | 6/2003 | Boeck ..................... H01R 12/62 439/276 |
| 7,291,036 | B1 * | 11/2007 | Daily ................. H05K 7/20445 439/487 |
| 8,308,504 | B2 * | 11/2012 | Ackermann ............ H02S 40/34 439/496 |
| 2006/0219291 | A1 * | 10/2006 | Hikosaka et al. ............. 136/251 |
| 2006/0243318 | A1 * | 11/2006 | Feldmeier et al. ........... 136/244 |
| 2008/0115822 | A1 * | 5/2008 | Cunningham et al. ....... 136/244 |
| 2008/0232040 | A1 * | 9/2008 | Li ............................ H02G 3/08 361/676 |
| 2008/0236886 | A1 * | 10/2008 | Gerull ..................... H02S 40/34 174/535 |
| 2009/0272574 | A1 * | 11/2009 | Richter et al. ................ 174/548 |
| 2010/0075531 | A1 * | 3/2010 | Beck ................ H01L 31/02013 439/405 |
| 2011/0108085 | A1 * | 5/2011 | Quiter ............... H01L 31/02013 136/244 |

* cited by examiner

*Primary Examiner* — Daniel P Malley, Jr.
(74) *Attorney, Agent, or Firm* — Barley Snyder

(57) ABSTRACT

The present invention relates to a solar photovoltaic assembly. The solar photovoltaic assembly, according to the invention, includes a solar panel, an input junction box, and an output junction box. The input junction box includes a first diode, a first electric connection body connected to the first diode, and first foils respectively spliced with the first electric connection body. The input junction box is positioned on a side of the second solar panel. The output junction box includes a second diode, a second electric connection body connected to the second diode, and second foils respectively spliced with the second electric connection body. The output second junction box positioned on another side of the solar panel. The input junction box mechanically and electrically connects to a second output junction box on a connecting solar panel using a cable.

7 Claims, 3 Drawing Sheets

SOLAR PHOTOVOLTAIC ASSEMBLY

CROSS-REFERENCE TO RELATED APPLICATIONS

This application claims priority under 35 U.S.C. § 119 to Chinese Patent Application No. 201020167043.6 filed on Apr. 20, 2010.

FIELD OF THE INVENTION

The present invention relates to solar electrical energy generation technology, and in particular, to a solar photovoltaic (PV) assembly.

BACKGROUND

Solar energy is one kind of regenerative energy. People show more and more interest in solar energy technology by which solar energy is converted into electric energy, since it has the advantages of energy conservation and reduction of environmental pollution. This technology also contributes to mitigate power supply demand to a certain extent. Solar electrical energy generation technology is a technology of converting the solar energy into electric energy by utilization of solar panels, based on principle of the photovoltaic effect. The basic element in the solar photovoltaic assembly is solar cell, such as solar thin-film cell. The solar panel usually includes a plurality of solar cells connected with each other. The junction box for the solar photovoltaic assembly is used for achieving interconnection between these solar panels.

In the conventional solar photovoltaic assembly, these solar panels are mechanically and electrically connected in junction boxes which are integrated with solar panels. Specifically, as shown in FIG. 1, a known solar photovoltaic assembly A or B is equipped with a junction box 100. As shown in FIG. 2, several known connection assemblies adapted for being connected with the cells on the solar panels are provided in the junction box 100. The connection assembly includes connecting terminals 110 and a by-pass diode 120. Each two junction boxes are connected using a cable 4. The connection between the junction boxes requires a cable of certain length because the solar panel usually is relatively bulky. It is well-known for those skilled in the art that the cable used in the solar PV field is relatively high in price and use. For example, among the cost of the connection among these solar panels, the cost of the cable takes a most significant part of it. Meanwhile, in the known junction box, several connection assemblies are integral into one junction box. Once some elements in the connection assembly go wrong, the whole junction box should be detached for maintenances. This presents a problem in operating efficiently and increased maintenance cost.

Therefore, it is desirable in the art to contribute a design which brings forth cost reduction and convenience for maintenances, without affecting the connection among the conventional solar panels.

SUMMARY

In view of the above-mentioned technical problem, it would be advantageous to provide a solar photovoltaic (PV) assembly including several junction box sets, in which each junction box set has a set of connection assembly. Compared to the known conventional whole junction box, the present invention provides fragmental junction box sets other than the integral junction box, which is advantageous for the usage and maintenance of the junction box.

The solar photovoltaic assembly, according to the invention, includes a solar panel, an input junction box, and an output junction box. The input junction box includes a first diode, a first electric connection body connected to the first diode, and first foils respectively spliced with the first electric connection body. The input junction box is positioned on a side of the second solar panel. The output junction box includes a second diode, a second electric connection body connected to the second diode, and second foils respectively spliced with the second electric connection body. The output second junction box positioned on another side of the solar panel. The input junction box mechanically and electrically connects to a second output junction box on a connecting solar panel using a cable.

BRIEF DESCRIPTION OF THE DRAWINGS

These and/or other objectives, features and advantages of the invention will become apparent and more readily appreciated from the following description of the embodiments, taken in conjunction with the accompanying drawings of which.

DETAILED DESCRIPTION OF THE EMBODIMENT(S)

The embodiments of the present disclosure will be described hereinafter in detail with reference to the attached drawings. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

Figure 1:
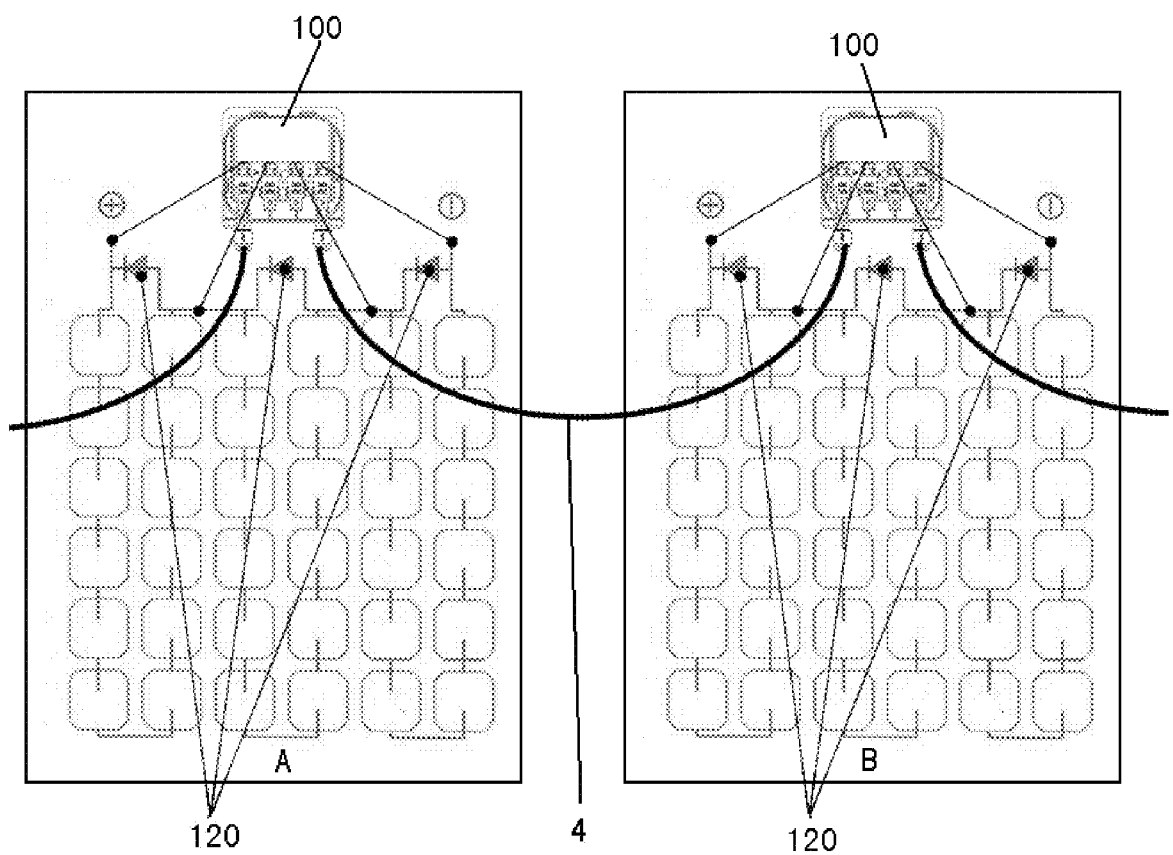
FIG. 1 is a schematic view showing known solar panels connected through known junction boxes by a cable.
Figure 2:
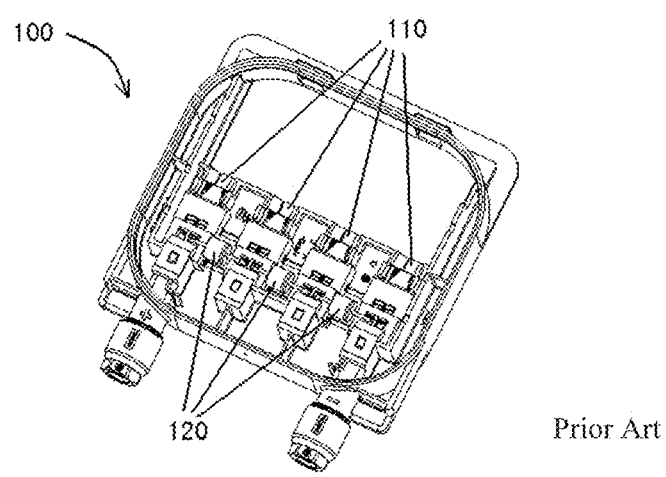
FIG. 2 is a perspective view of a known junction box of a known solar PV assembly.
Figure 3:
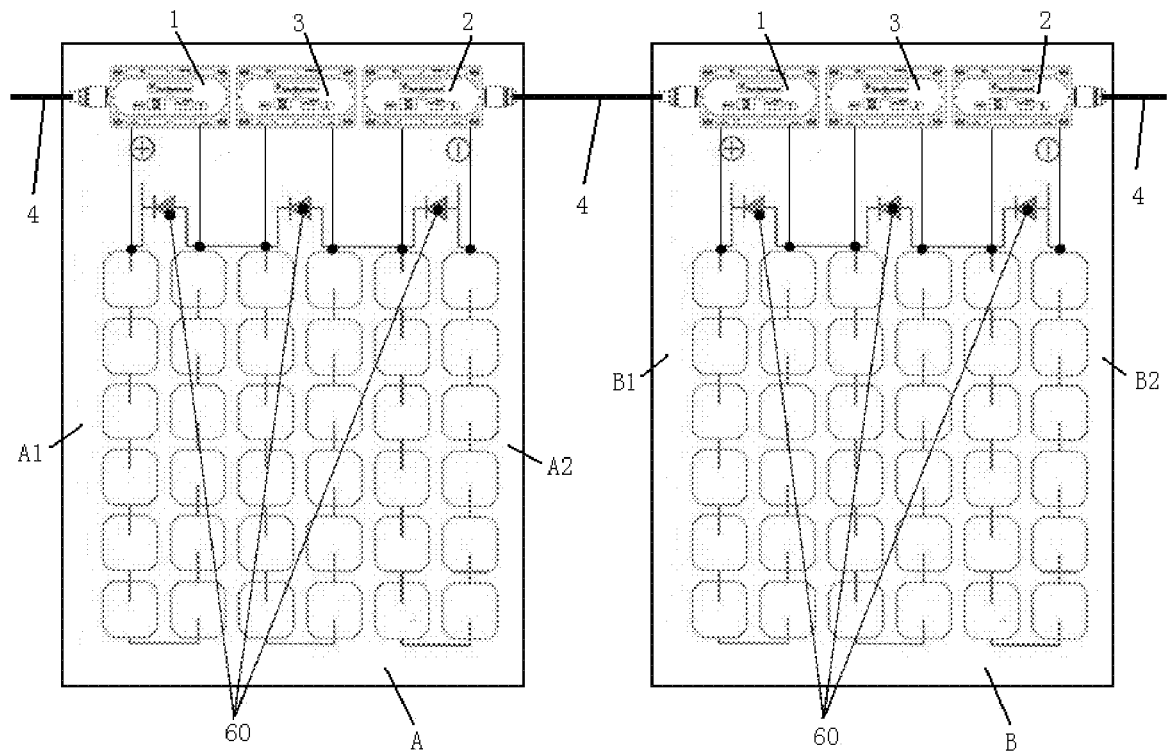
FIG. 3 is a schematic view showing a solar PV assembly according to invention.

Referring to FIGS. 3-6, a solar PV assembly is capable of being used on the solar panels A, B to achieve mechanical and electrical connection between the adjacent solar panels. Specifically, the junction boxes in the solar PV assembly according to the invention, include a plurality of junction box sets (e.g., the first and second junction boxes and the middle junction box that will be described hereinafter). FIG. 3 shows a layout of a solar PV assembly according to the invention in which the plurality of junction box sets are used. The junction box sets of the solar PV assembly at least includes first/second junction boxes respectively disposed near first/second junction boxes of the solar PV assembly, in which, connection assembly in the first/second junction boxes is used for connection with not only the cell set of the solar panel but also the connection assembly in the corresponding junction box of the other solar panel. Particularly, FIG. 3 shows a solar photovoltaic assembly, according to the invention, includes a plurality of first and second solar panels A, B disposed to be adjacent to each other and several sets of first and second junction boxes 1, 2. At least one set of first and second junction boxes 1, 2 is positioned on each of the first and second solar panels A, B. Each of the first and second junction boxes 1, 2 at least includes a diode 60, electric connection body connected to the diode 60, and, foils 20 respectively spliced with the electric connection body and adapted for connection with positive and negative electrodes of the cell on the first solar panel A, respectively. The second junction box 2 is positioned on a second side A2 of the first solar panel A while the first junction box 1 is arranged on a first side B1 of the second solar panel B. The second junction box 2 on the first solar panel A and the first junction box 1 on the second solar panel B are mechanically and electrically connected with each other using a cable 4. Thus, as compared to the known conventional design, the design and arrangement of the solar PV assembly according to the invention not only effectively shortens the length of the cable 4 between the second junction box 2 of the solar panel A and the first junction box 1 of the solar panel B, but also reduces the cost.

According to the embodiment shown in FIG. 3, each of the first and second solar panels A, B further includes at least one middle junction box 3 positioned between the first junction box 1 and the second junction box 2 on each of the first and second solar panels A, B (or any other locations except both sides of the solar panel near to the adjacent solar panel). The at least one middle junction box 3 at least includes a diode 60, electric connection body connected to the diode 60, and, foils 20 respectively spliced with the electric connection body and adapted for connection with positive and negative electrodes of the cell on the first solar panel A, respectively.

When compared to a known junction box integrated with multiple connection assemblies, the solar photovoltaic (PV) assembly according to the invention includes junction box sets. Particularly, the solar photovoltaic (PV) assembly according to the invention includes several junction box sets, such as the above-mentioned first and second junction box and the middle junction box. With the above configuration, it reduces the volume of the junction box and is advantageous for disposition of the junction boxes on the solar panel. Also, the solar photovoltaic (PV) assembly according to the invention reduces the length of the cable for the connection between the junction boxes on the adjacent solar panels so as to reduce the use-cost.

Description of the junction box set (e.g., the first junction box) according to the invention will be made in detail hereinafter in conjunction with FIGS. 4-6. Meanwhile, for the convenience of description, the connection assembly according to the shown embodiment includes an electric connection body having connecting terminals 10, 30, a conductor 31, foils 20, and, a diode 60. It should be noted that the connection assembly may further include other elements besides the elements mentioned here in the description.

Figure 4:
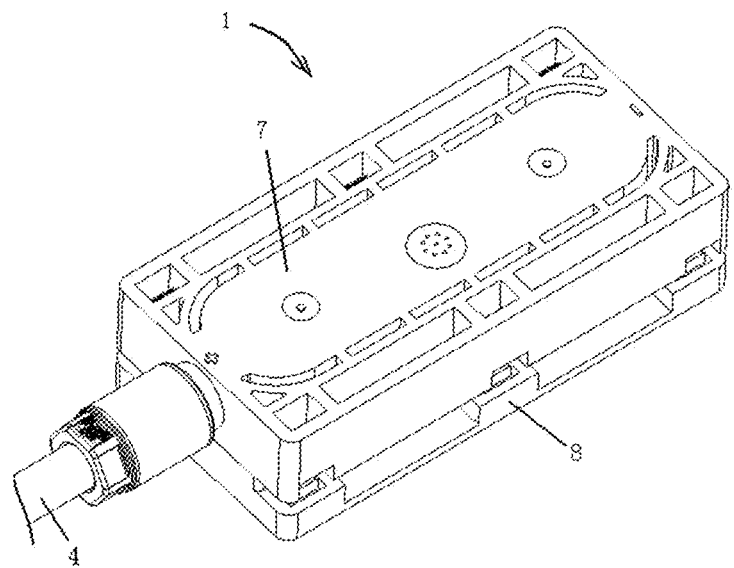
FIG. 4 is a perspective view of one junction box of a solar PV assembly according to the present invention.
Figure 5:
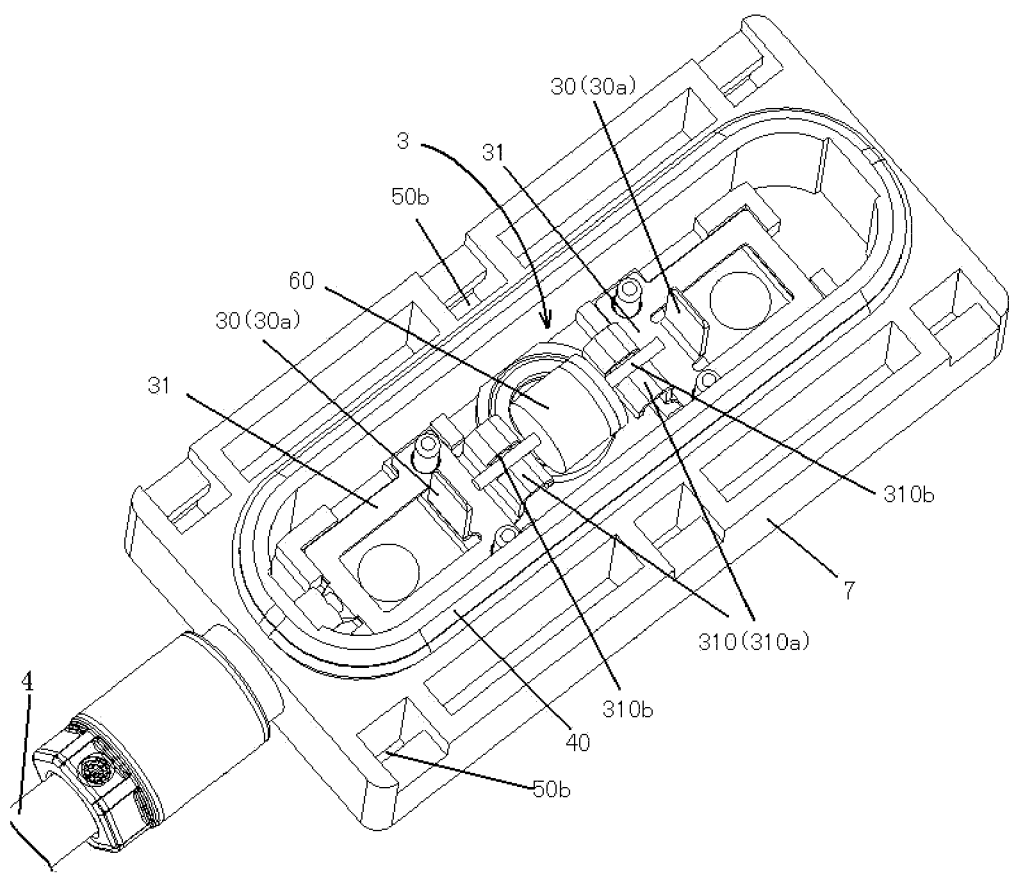
FIG. 5 is a perspective view the junction box of FIG. 4, showing an upper case of junction box when the upper case is detached from the lower case.
Figure 6:
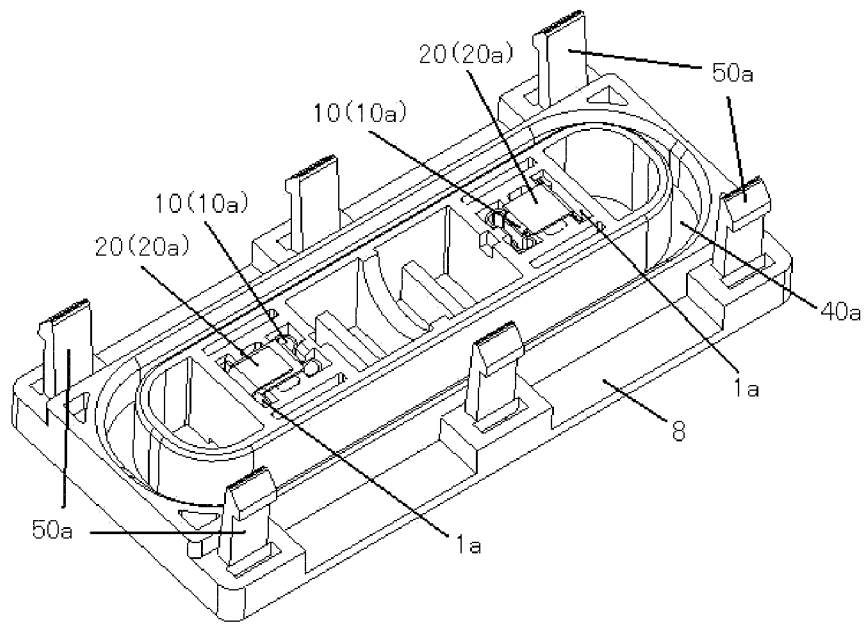
FIG. 6 is a perspective view of the junction box of FIG. 4, showing a lower case when the lower case is detached from the upper case.

As shown in FIGS. 4-6, the first junction box 1 mainly comprises a lower case 8, an upper case mated with the lower case 8, and, connection assembly accommodated therein. FIG. 4 shows a first junction box 1 according to the embodiment.

According to the embodiment shown in FIGS. 5 and 6, in the first junction box 1, the connection assembly includes a diode 60, electric connection body connected to the diode 60, and, foils 20 respectively spliced with the electric connection body and adapted for connection with positive and negative electrodes of the cell on the first solar panel A, respectively. Specifically, the electric connection body has a first connecting terminal 10 with which the foil 20 is spliced, a second connecting terminal 30 engaged with the first connecting terminal 10 by a crimp connection, for example, and a conductor 31 connected to the diode 60.

Particularly, as shown in FIG. 5, the conductor 31 and the second connecting terminal 30 of the electric connection body, and the diode 60, are positioned on the upper case 7. As shown in FIG. 6, the first connecting terminal 10 of the electric connection body, and the foils 20, are positioned on the lower case 8. When the upper case 8 and the lower case 7 are mated with each other, the first connecting terminal 10 and the second connecting terminal 30 are engaged with each other by a crimp connection. A cable 4 is connected to the conductor 31. The conductor 31 and the second connecting terminal 30 are integrally formed into one piece, in the embodiment shown.

According to the invention, one of the first connecting terminal 10 and the second connecting terminal 30 has a female portion 10a, the other of the first connecting terminal 10 and the second connecting terminal 30 has a male portion 30a, and, the female portion 10a and the male portion 30a are engaged with each other in a crimp connection manner. Specifically, according to the embodiment of the present invention, as shown in FIGS. 5 and 6, the first connecting terminal 10 disposed in the lower case 8 has a female portion 10a, the second connecting terminal 30 disposed in the upper case 7 has a male portion 30a, and, the female portion 10a of the first connecting terminal 10 and the male portion 30a of the second connecting terminal 30 are engaged with each other in a crimp connection manner when the lower case 8 and the upper case 7 are engaged with each other, so as to achieve the electrical connection between the first connecting terminal 10 and the second connecting terminal 30. Alternatively, in another embodiment, the second connecting terminal 30 positioned in the upper case 7 may have a female portion 10a while the first connecting terminal 10 positioned in the lower case 8 may have a male portion 30a.

Specifically, in the embodiment as shown in FIGS. 5 and 6, the male portion 30a is an insert, and the female portion 10a is a slot allowing for insertion of the insert. Thus, once the lower case 8 and the upper case 7 are mated with each other, the female portion 10a of the first connecting terminal 10 and the male portion 30a of the second connecting terminal 30 are engaged with each other by a crimp connection, so as to achieve the electrical connection. Meanwhile, in the embodiment shown in FIG. 6, the foil 20 positioned in an opening 1a of the lower base 8 and adapted for connection with the solar panel has a flat structure 20a at one end. The flat structure 20a is to be engaged with the first connecting terminal 10 by a crimp connection to achieve electrical connection therebetween.

Furthermore, as shown in FIG. 5, the conductor 31 includes a pair of elastic pieces 310 opposed with each other. Each of the elastic pieces 310 has one end being inwardly curved toward the other elastic piece 310 so as to form two opposed curved surfaces 310a. The curved surfaces 310a are respectively provided at both lateral sides of the diode 60 to hold the diode 60 therein. The curved surfaces 310a respectively have slots 310b to receive the legs of the diode 60 therein. Alternatively, in another embodiment, the conductor 31 may have a flat structure. Preferably, the conductor 31 and the second connecting terminal 30 are formed into one piece.

Furthermore, the first junction box 1 further includes a sealing ring 40. Specifically, as shown in FIG. 5, the sealing ring 40 is positioned outside at the peripheral of a connection assembly. Correspondingly, as shown in FIG. 6, in the lower case 8, a sealing groove 40a adapted for receiving a sealing ring 40 therein is formed on the peripheral of the connection assembly. Thus, the sealing ring 40 is received in the sealing groove 40a so as to achieve the sealing engagement. It is worthy to be mentioned that, in another embodiment of the invention, any other sealing structure may be adopted to achieve the sealing engagement between the upper and lower cases 7, 8.

In addition, the first junction box 1 further comprises a lock device adapted for securely affixing the upper and lower cases 7, 8. Specifically, as shown in FIGS. 5 and 6, the lock device comprises a locking mechanism 50a provided at the lower case 8 and a locking groove 50b provided at the upper case 7, the locking groove 50b is engaged with the locking mechanism 50a to achieve the engagement between the upper and lower cases 7, 8. That is to say, the solar photovoltaic assembly according to the present invention may be assembled in a fixed manner by engagement between the above-mentioned upper and lower cases 7, 8. Once some elements in the connection assembly go wrong, the upper case 7 may be conveniently detached from the lower case 8 for the purpose of maintenance. Further, the solar photovoltaic assembly according to the present invention may be reused for several times so that the use-cost of the junction box is reduced. It is worthy to be mentioned that, any other lock structures which are easy for the connection and the detachment of the upper case and the lower case may be adopted in another embodiment of the present invention.

Hence, because the lower case 8 of the junction box in the solar photovoltaic (PV) assembly is securely mounted onto the solar panel while most of the important elements are disposed on the upper case 7, which may be detachable from the lower case 8, once some important elements (e.g., the diode 60) in the connection assembly go wrong, the only operation for the operator to do is to detach the upper case 7 of the junction box from the lower base 8 securely mounted on the solar panel for the purpose of maintenance and replacement of the elements, instead of replacing the whole solar panel with the junction box. Therefore, the cost of use and maintenance of the junction box is greatly reduced.

It is worthy to mentioned, the above description only refers to the first junction box 1 as the junction box set in the invention. The second junction box 2 has the same/similar structure and function to that of the first junction box. Further, the middle junction box 3 has the same/similar structure and function to that of the first junction box 1, except that the third one can not be in connection with the external cable 4. For example, the middle junction box 3 comprises the lower case 8 and the upper case 7 engaged with the lower case 8. The diode 60, the conductor 31 of the electric connection body, and the second connecting terminal 30 are disposed in the upper case 7. The first connecting terminal 10 of the electric connection body and the foils 20 are disposed in the lower case 8. The first connecting terminal 10 and the second connecting terminal 30 are engaged with each other in a bayonet fixing manner when the lower case 8 and the upper case 7 are mated with each other. Therefore, the description about the second junction box 2 and the middle junction box 3 may be referred to that of the first junction box 1.

Although several embodiments have been shown and described, it would be appreciated by those skilled in the art that various changes or modifications may be made in these embodiments without departing from the principles and spirit of the disclosure, the scope of which is defined in the claims and their equivalents. It should be noted that the use of "a" or "an" before an element of the invention does not exclude a plurality of elements in the invention. It should also be noted that reference signs in the claims shall not be construed as limiting the scope of the claims.

What is claimed is:

1. A solar photovoltaic assembly, comprising:
   a first solar panel;
   an input junction box on the first solar panel and having:
   (a) a first upper case having a plurality of female locking grooves interior to an outermost side surface of the first upper case around a periphery,
   (b) a first electric connection body having a first connecting terminal, a second connecting terminal, and a conductor, with the second connecting terminal and the conductor on the first upper case,
   (c) a first diode attached to the conductor and the second connecting terminal,
   (d) a first cable attached to the conductor and the second connecting terminal and directly connected to the first upper case,
   (e) a first lower case having an obround shaped sealing groove receiving a sealing ring on a center inner periphery of the first lower case and a plurality of pairs of male locking mechanisms on opposite sides of the obround shaped sealing groove along a pair of u-shaped portions of the obround shaped sealing groove with the plurality of pairs of male locking mechanisms distally from one another at opposite ends along the u-shaped portions and another pair of male locking mechanisms centrally located along a pair of opposite parallel sides of the obround shaped sealing groove and the plurality of pairs of male locking mechanisms and the another pair of male locking mechanisms both interior to an outermost side surface of the first lower case and adjacent the obround shaped sealing groove, and the first lower case on a side of the first solar panel and having no cable, and
   (f) a plurality of first foils and the first connecting terminal on the first lower case and the first connecting terminal mating with the second connecting terminal when the plurality of female locking grooves engage the plurality of pairs of male locking mechanisms and the another pair of male locking mechanisms with all the plurality of female locking grooves and all of the plurality of pairs of male locking mechanisms and the another pair of male locking mechanisms interior to the outermost side surface of the first upper case and the first lower case and adjacent to the sealing groove along the center inner periphery with the outermost side surface of the first upper case and the first lower case flush with one another; and
   an output junction box on a second solar panel mechanically and electrically connected to the input junction box on the first solar panel and having:
   (a) a second upper case having a plurality of female locking grooves around a periphery,
   (b) a second electric connection body,
   (c) a second diode attached to the second electric connection body,
   (d) only a second single cable attached to the second electric connection body and directly connected to the second upper case, (e) a second lower case having an obround shaped sealing groove receiving a sealing ring, the sealing groove on a periphery of the second lower case and a plurality of pairs of male locking mechanisms on opposite sides of the obround shaped sealing groove along a pair of u-shaped portions of the obround shaped sealing groove the plurality of pairs of male locking mechanisms distally from one another at opposite ends along the u-shaped portions and another pair of male locking mechanisms centrally located along a pair of opposite parallel sides of the obround shaped sealing groove, and the second lower case mounted on another side of the first solar panel and having no cable, and (f) a plurality of second foils on the second lower case that contact the second electric connection body when the plurality of second upper case female locking grooves engage both the plurality of second lower case male locking mechanisms and the another pair of second lower case male locking mechanisms.

2. The solar photovoltaic assembly according to claim 1, further comprising an intermediate junction box on the first solar panel or the second solar panel, the intermediate junction box including a third diode, a third electric connection body connected to the third diode, and a plurality of third foils respectively spliced with the third electric connection body.

3. The solar photovoltaic assembly according to claim 2, wherein each of the second and third electric connection bodies has a first connecting terminal, a second connecting terminal, and a conductor, the respective foils are spliced with each first connecting terminal, each second connecting terminal is engaged respectively with each first connecting terminal by a crimp connection, and each conductor is connected to the respective diode.

4. The solar photovoltaic assembly according to claim 3, wherein each of the first single and the second single cables respectively, electrically connects the first solar panel to the second solar panel and a third solar panel, and are each connected to the respective conductor.

5. The solar photovoltaic assembly according to claim 3, wherein the conductor extends continuously from the second connecting terminal.

6. The solar photovoltaic assembly according to claim 4, wherein the first connecting terminal or the second connecting terminal includes a female portion, the other of the first connecting terminal or the second connecting terminal includes a male portion, and the female portion and male portion are connected by the crimp connection.

7. The solar photovoltaic assembly according to claim 6, wherein the first connecting terminal and the second connecting terminal are connected by the crimp connection when the upper case and the lower case are connected with each other.

\* \* \* \* \*